(12) United States Patent
Anderl et al.

(10) Patent No.: US 7,408,774 B1
(45) Date of Patent: Aug. 5, 2008

(54) REAL TIME ADAPTIVE ACTIVE FLUID FLOW COOLING

(75) Inventors: William James Anderl, Rochester, MN (US); Cary Michael Huettner, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/682,578

(22) Filed: Mar. 6, 2007

(51) Int. Cl.
H05K 7/20 (2006.01)
H05K 5/00 (2006.01)

(52) U.S. Cl. ............ 361/695; 361/694; 361/697; 361/719; 454/184; 174/16.1; 415/60; 415/213.1

(58) Field of Classification Search ......... 361/688–690, 361/694–695, 697, 719; 165/80.3, 104.33, 165/122, 908; 174/16.1; 415/60, 143, 213.1; 454/184; 700/300
See application file for complete search history.

(56) References Cited

U.S. PATENT DOCUMENTS 4,648,007 A * 3/1987 Garner ............... 361/695
6,364,761 B1 * 4/2002 Steinbrecher ............ 454/184
2007/0047200 A1 * 3/2007 Huang ................. 361/695

OTHER PUBLICATIONS

Effective redundant cooling Fan swivel mechanism for Multiple Processor System, IBM Technical Disclosure, Issue 440, p. 2230, Dec. 1, 2000.*

* cited by examiner

*Primary Examiner*—Jayprakash N Gandhi
*Assistant Examiner*—Robert J Hoffberg
(74) *Attorney, Agent, or Firm*—Matthew C. Zehrer

(57) ABSTRACT

The present invention is generally directed to an apparatus providing real time adaptive active fluid flow cooling, for cooling an electronic system, an electronic system utilizing the same, and a method for providing real time adaptive active fluid flow cooling. The electronic system consists of a circuit board having a heat generating component, a heat dissipating element mounted to the heat generating component and an apparatus for providing real time adaptive active flow cooling. The apparatus consisting of a plurality of active cooling devices that remove heated air or fluid with ambient air or fluid by propelling an fluid flow stream in a first direction toward the heat dissipating element, and where at least one active cooling device contained in the plurality of active cooling devices propels an fluid flow stream in a second direction toward the heat dissipating element.

8 Claims, 18 Drawing Sheets

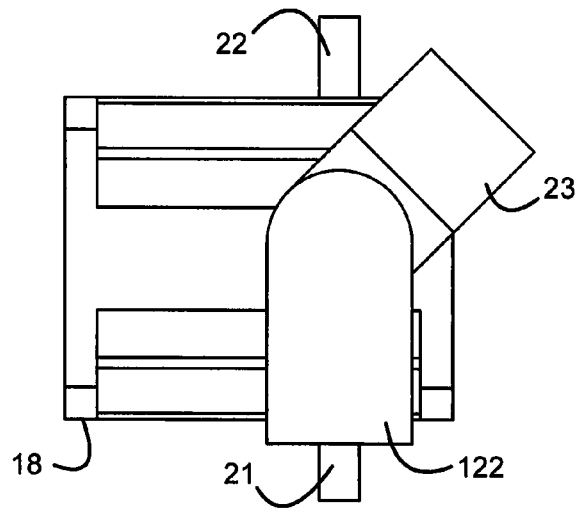
Fig. 6
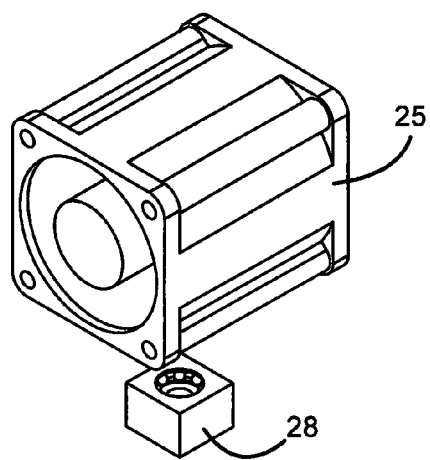
Fig. 7A
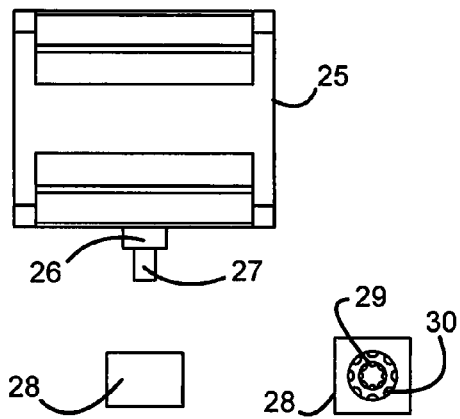
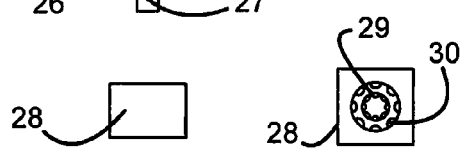
Fig. 7B    Fig. 7C

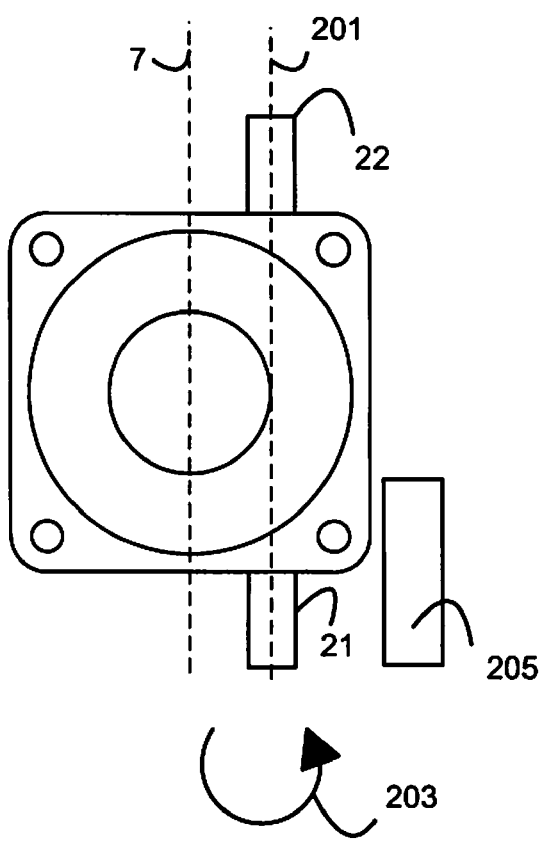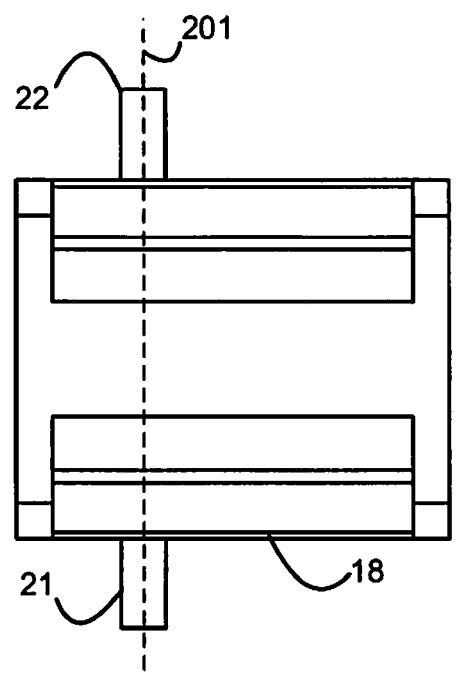
Fig. 23B
Fig. 23A

REAL TIME ADAPTIVE ACTIVE FLUID FLOW COOLING

BACKGROUND OF THE INVENTION

1. Field of the Invention

The present invention generally relates to electronic system cooling. In particular, an embodiment of the invention relates to an adaptive active cooling device.

2. Description of the Related Art

Electronic system components (e.g., central processing units (CPUs), graphics cards, hard drives, etc.) generate large amounts of heat during operation. This heat must be removed from the components in order to maintain safe operating temperatures. Overheated parts generally exhibit a shorter maximum life-span and may give sporadic problems resulting in system freezes or crashes. The foremost heat removal technique adds heat dissipating elements to hot surfaces thereby increasing the area of heat dissipation. In many instances fans, or other active cooling devices, exchange the heated air or fluid with cooler ambient air or fluid. In other instances the power supplied to the system components is throttled down in order to decrease heat generation.

SUMMARY OF THE INVENTION

The present invention is generally directed to an apparatus for cooling an electronic system, an electronic system utilizing the same, and a method for providing real time adaptive active fluid flow cooling.

As processors, graphics cards, random access memory (RAM) and other components in computers have increased in clock speed and power consumption, the amount of heat produced by these components has also increased. Therefore removing heat has become a high priority for electronic manufacturers. So much so that in many cases, electronic systems are designed with multiple fans or other active fluid moving devices cooling specific components. In these cases more fans are utilized than are necessary to prevent overheating if one of the fans fails. This design technique is otherwise known as redundant cooling.

Utilizing more fans than necessary adds costs, with incremental benefit in normal operation, to the electronic system. Therefore there is a need for an apparatus for cooling an electronic system, an electronic system utilizing the same, and a method for providing real time adaptive active fluid flow cooling utilizing only the number of fans necessary to adequately cool the heat generating component while concurrently providing for acceptable cooling when there is a partial failure of the cooling system (i.e., when at least one fan fails to propel an air stream).

In an embodiment, an apparatus for cooling an electronic system is described. The apparatus consists of a circuit board having a heat generating component, a heat dissipating element mounted to the heat generating component, and a plurality of active cooling devices that remove heated air or fluid with ambient air or fluid by propelling an air or fluid flow stream in a first direction toward the heat dissipating element, and in response to the partial failure of the cooling system, at least one active cooling device contained in the plurality of active cooling devices propels an air or fluid flow stream in a second direction toward the heat dissipating element.

In an alternative embodiment, an electronic system utilizing the apparatus for cooling is described.

In an alternative embodiment a method providing for real time adaptive active fluid flow cooling is described. The method comprising the steps of: providing for at least one heat generating component on a circuit board within an electronic system to warm to a temperature higher than the electronic system ambient temperature; providing for the cooling of the at least one heat generating component by mounting a heat dissipating element thereupon; providing for the cooling of the heat dissipating element by directing the fluid flow streams of one or more active cooling device(s) toward the dissipating element; and in response to a partial failure event, directing the fluid flow stream of one or more active cooling device(s) toward the heat dissipating element in a second direction.

BRIEF DESCRIPTION OF THE DRAWINGS

So that the manner in which the above recited features of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

FIG. 6 illustrates a side view of the embodiment depicted in FIG. 5.

FIG. 7A illustrates, according to an embodiment of the invention, an isometric exploded view of an alternate particular active cooling device and a connector.

FIG. 7B illustrates a side view of the embodiment depicted in FIG. 7A.

FIG. 7C illustrates a top view of the connector depicted in FIG. 7A and FIG. 7B.

FIG. 23A illustrates, according to an embodiment of the invention, a front view of an active cooling device having spindles mounted on an axis offset from the bisection axis.

FIG. 23B illustrates, according to an embodiment of the invention, a side view of the active cooling of FIG. 23A.

DETAILED DESCRIPTION OF THE PREFERRED EMBODIMENTS

The present invention is generally directed to an apparatus for cooling an electronic system, an electronic system utilizing the same, and a method for providing real time adaptive active fluid flow cooling.

Figure 1:
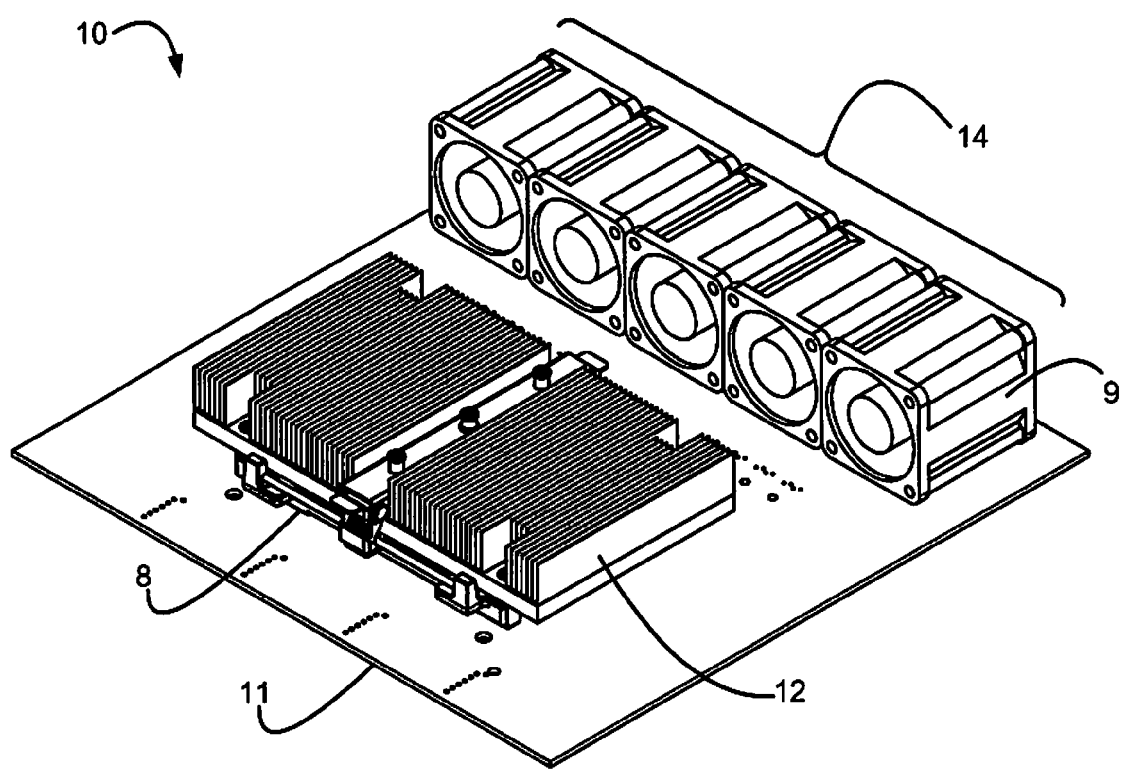
FIG. 1 illustrates a prior art apparatus for cooling an electronic system and is an example of redundant cooling.

FIG. 1 illustrates a prior art apparatus 10 for cooling an electronic system. Further, apparatus 10 is an example of redundant cooling. Apparatus 10 consists of a circuit board 11 having a heat generating component 8 thereupon. Heat generating component may be any electrical component that generates heat (e.g., processor chip, etc). Heat dissipating element 12 is mounted to heat generating component 8 thereby increasing the area of heat dissipation. Heat dissipating element may be any known heat dissipation apparatus (e.g., heat sink, heat pipe, etc). A bank 14 of fans 9 exchanges the heated air or fluid with cooler ambient air or fluid. Fans 9 are fixedly mounted to circuit board 11.

Figure 2:
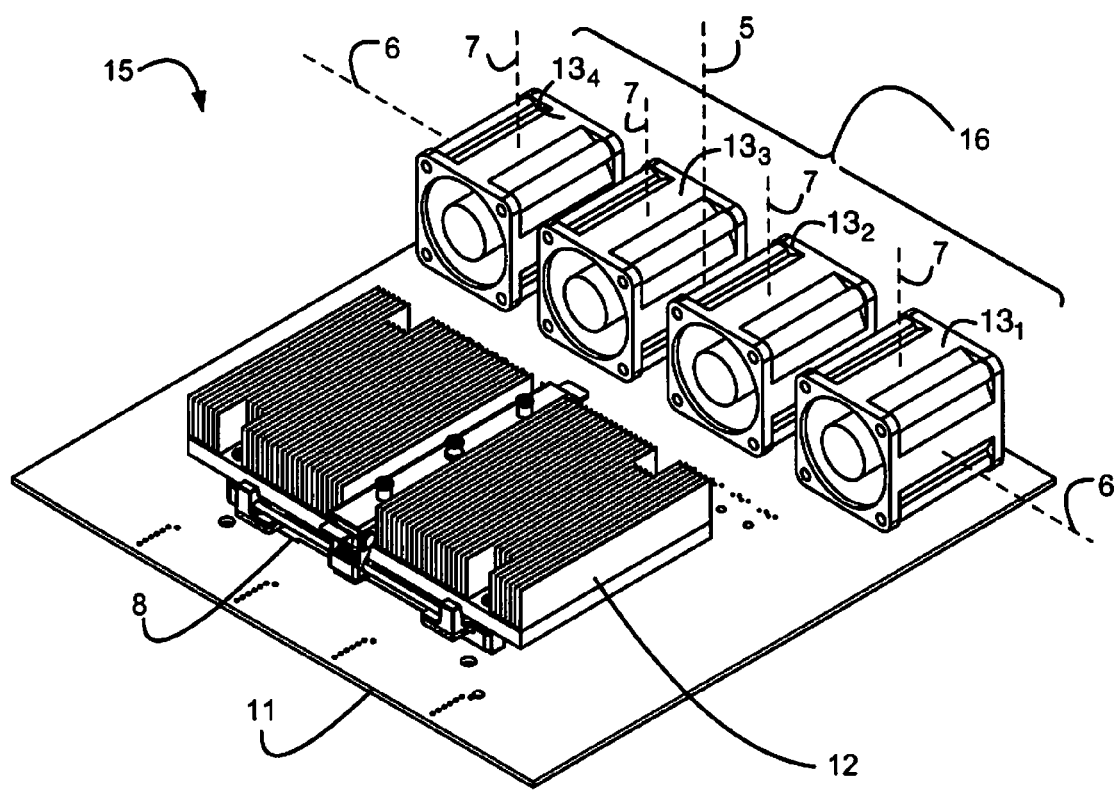
FIG. 2 illustrates, according to an embodiment of the invention, an apparatus for cooling an electronic system in a normal operating configuration.

FIG. 2 illustrates an apparatus 15 for cooling an electronic system in a normal operating configuration according to an embodiment of the present invention. A bank 16 of active cooling devices $13_1$-$13_4$, herein referred to generically as active cooling devices 13, exchanges heated air or other fluid with cooler air or fluid. The active cooling devices 13 are moveably mounted (e.g., rotatable) to circuit board 11. In a first embodiment, bank 16 rotates about axis 5. In a second embodiment, bank 16 rotates about axis 6. In a third embodiment, each active cooling device 13 rotates about axis 6. In a fourth embodiment, each active cooling device rotates about axis 7. In a particular embodiment, active cooling devices receive electrical signals from circuit board 11 through traditional cable and connector apparatuses (not shown), or any other known apparatus. Other embodiments teaching the mechanisms, apparatus, methods, etc. enabling the movement of the active cooling devices are further described below.

Figure 3:
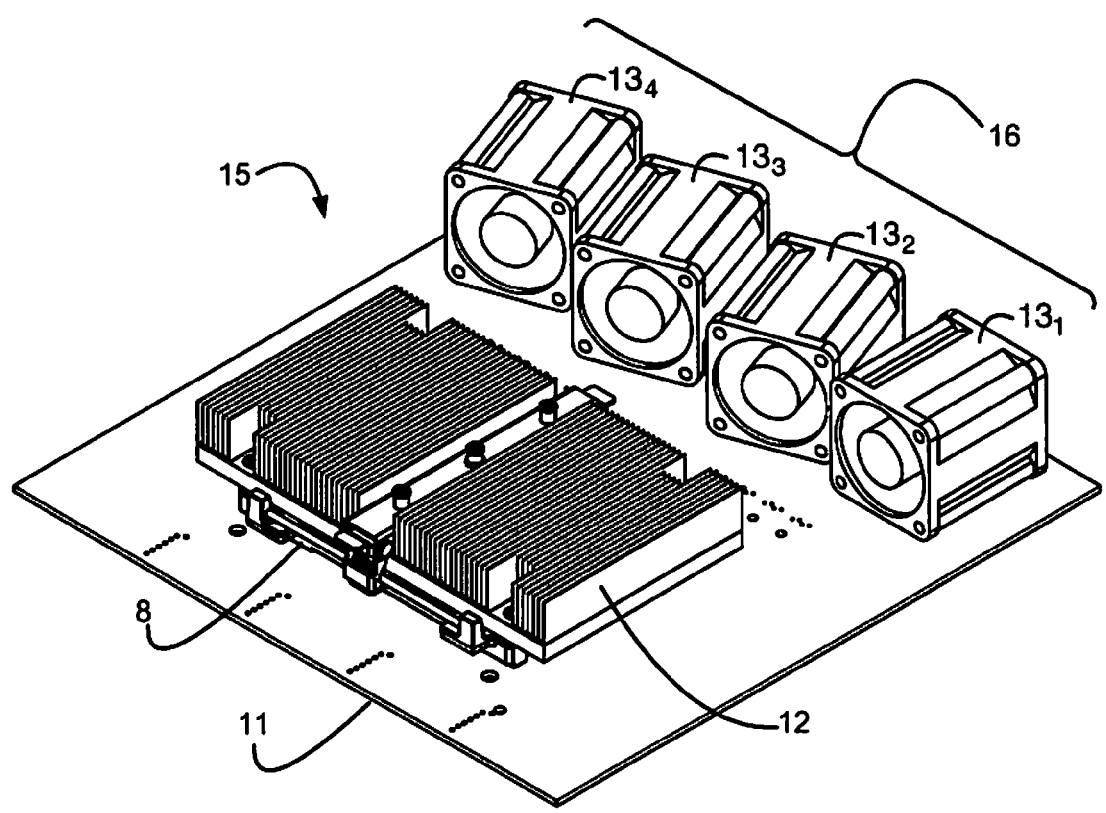
FIG. 3 illustrates, according to an embodiment of the invention, the apparatus of FIG. 2 in a configuration wherein one active cooling device has failed.

FIG. 3 illustrates a particular embodiment of apparatus 15 upon the failure of active cooling device $13_1$. Because of the failure, active cooling device $13_1$ is unable to propel a fluid stream, in a first direction, toward heat dissipating element 12. Active cooling devices $13_2$-$13_4$ move (e.g., rotate) toward the failed active cooling device $13_1$ to compensate for the loss of the fluid stream. In a particular embodiment the amount of fluid propelled by cooling devices $13_2$-$13_4$ is increased to maintain a particular fluid flow rate. This increasing or decreasing the flow rate emitted from the active moving device may be accomplished by any known environment feedback and adjustment mechanism. When the failed active cooling device $13_1$ is replaced with a functional active cooling device 13, active cooling devices $13_2$-$13_4$ back to the normal operating configuration as depicted in FIG. 2. Enablement of this particular rotation back may utilize the mechanisms, apparatus, methods, etc. of movement further described below. Other embodiments of rotation are enabled by any known powered rotation mechanism.

Figure 4A:
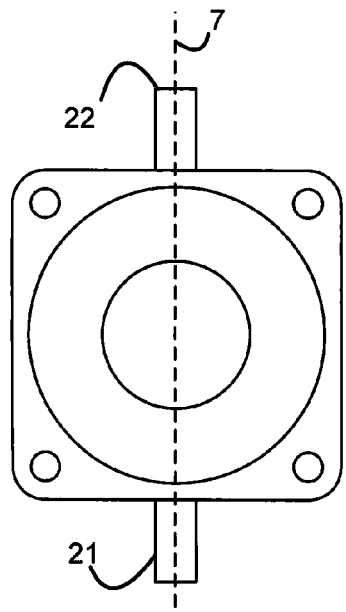
FIG. 4A illustrates, according to an embodiment of the invention, the front view of a particular active cooling device.
Figure 4B:
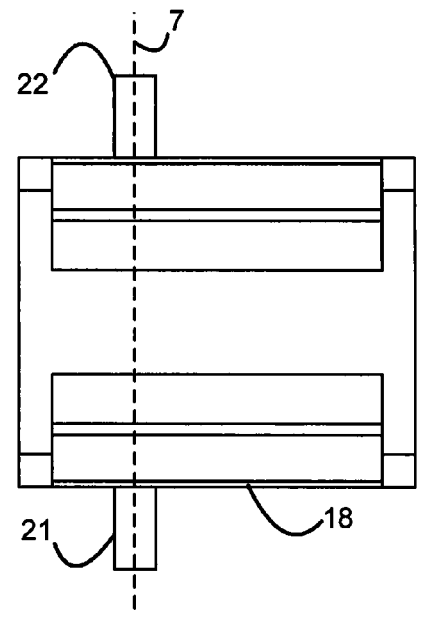
FIG. 4B illustrates the side view of the particular active cooling device of FIG. 4A.

FIG. 4A and FIG. 4B illustrate active cooling device 18 able around axis 7. Active cooling device 18 is similar to active cooling device 13, however active cooling device 18 utilizes at least one spindle to allow for rotation. In a particular embodiment, active cooling device 18 moves (e.g., rotates) about two spindles 21 and 22. Spindles 21 and 22 are rotatable in relation to another body. In particular embodiments spindles 21 and 22 are an axle, axis, pin, rod, shaft, etc. In a particular embodiment spindles 21 and 22 are conductive, or in other words can carry an electric charge. In the particular embodiment where spindles 21 and 22 are conductive, they can be utilized to carry current to or from the active cooling device 18 to or from circuit board 11. In other embodiments spindles are hollow serving as a conduit for electrical wires carrying electrical signals to the active cooling devices.

In a particular embodiment, as shown in FIG. 23A and FIG. 23B, axis 201 is offset from the active cooling device 18 bisection axis (e.g., axis 7). When spindles 21 and 22 are attached to active cooling device 18 on axis 201, the force of the propelled fluid stream emitted from active cooling device 18 creates a moment 203, on active cooling device 18, about axis 201. The moment 203 causes active cooling device 18 to move (e.g., rotate). In order to ensure the fluid stream is emitted in a first desired direction retention 205 is utilized. Retention 205 is attached to circuit board 11 (not shown in FIG. 23A). When it is desired to emit the fluid stream in a second direction, retention 205 is disabled. When retention 205 is disabled active cooling device 18 is free to rotate.

Figure 5:
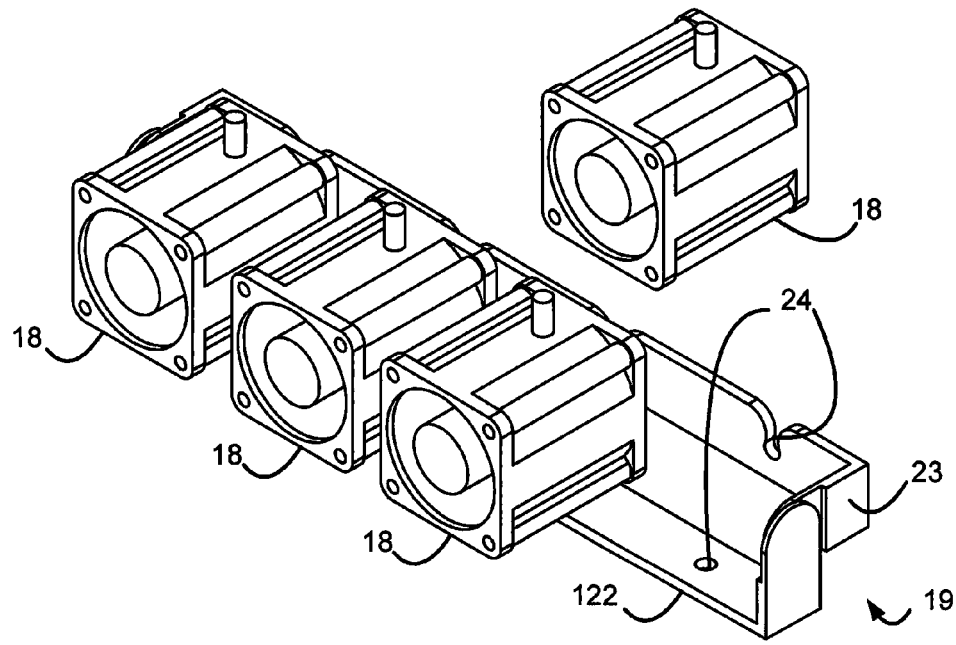
FIG. 5 illustrates, according to an embodiment of the invention, an exploded view of the support structure supporting a plurality of the particular active cooling device of FIG. 4A.

FIG. 5 illustrates an exploded view of the support structure 19 supporting a plurality of cooling devices 18. Support structure 19 consists of lower portion 122 and upper portion 23. Lower portion 122 and upper portion 23 have connector 24 configured to accept spindle 21. Cooling devices 18 install into support structure 19 by inserting spindle 21 into connector 24 of lower portion 122. In a particular embodiment upper portion 23 is moveable (e.g. rotatable) relative to lower portion 122. Upper portion 23 rotates until connector 24 accepts spindle 22. This motion is represented in FIG. 6. In an alternative embodiment, upper portion 23 is installed to lower portion 122 by lowering upper portion 23 onto lower portion 122. In another embodiment, lower portion 122 is coupled to circuit board 11. Connector (not shown) on lower portion 122 provides lower portion 122 to receive electrical signals from circuit board 11. Through the connection between lower portion 122 and upper portion 23 the electrical signals may be passed to upper portion 23. In this manner connector 24 provides electrical signals to spindles 21 and 22 respectively. The electrical signals provide active cooling devices 18 with power, control, rotation speed, etc. signals. In another embodiment spindle 21 passes through lower portion 122 and is conjoined with connector means (not shown) on circuit board 11. The electrical signals from circuit board 11 pass to active cooling device 18 through spindles 21 and 22. In another embodiment spindles 21 and 22 may be hollow and serving as a conduit, to allow for electrical wires (not shown) to transmit electrical signals (i.e. power, control, rotation speed, etc) to active cooling device 18.

FIG. 7A, FIG. 7B, and FIG. 7C illustrate active cooling device 25 and connector 28. In this embodiment, at least one connector 28 is mounted to circuit board 11. At least one active cooling device 25 attach to connector 28. As described previously, with reference to active cooling device 18, active cooling device 25 rotates about axis 7 (FIG. 4A). Active cooling device 18 utilizes at least one spindle to provide for rotation. In the embodiment shown in FIG. 7B, two spindles 26 and 27 are utilized to provide for rotation. In a particular embodiment to aid rotation, one or more ball bearing sets 29 and 30 may be utilized. In another embodiment the one or more spindles 26 and 27 may be fixed relative to active cooling device 25, wherein only the one or more ball bearing sets 29 and 30 provide for rotation. In another embodiment spindle 29 and 30 are hollow and provide a conduit to route electrical cables to transmit electrical signals (i.e., power, control, rotation speed, etc) to active cooling device 25 from circuit board 11.

Figure 8:
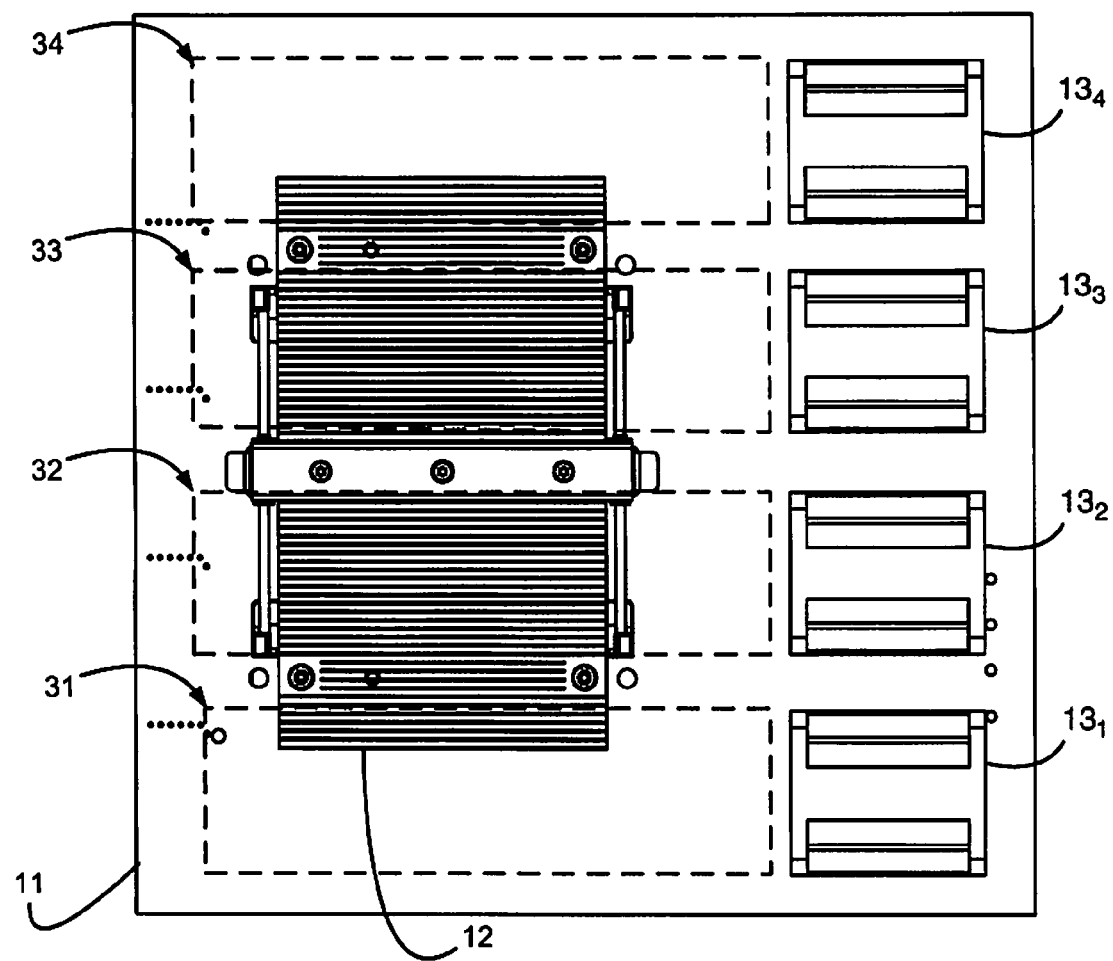
FIG. 8 illustrates, according to an embodiment of the invention, a top view of the apparatus of FIG. 2.

FIG. 8 illustrates a top view of apparatus 15 in an operating configuration wherein all active cooling devices $13_1$-$13_4$ are functional. Active cooling devices $13_1$-$13_4$ each propel fluid streams contained in spatial volumes 31-34 respectively.

Figure 9:
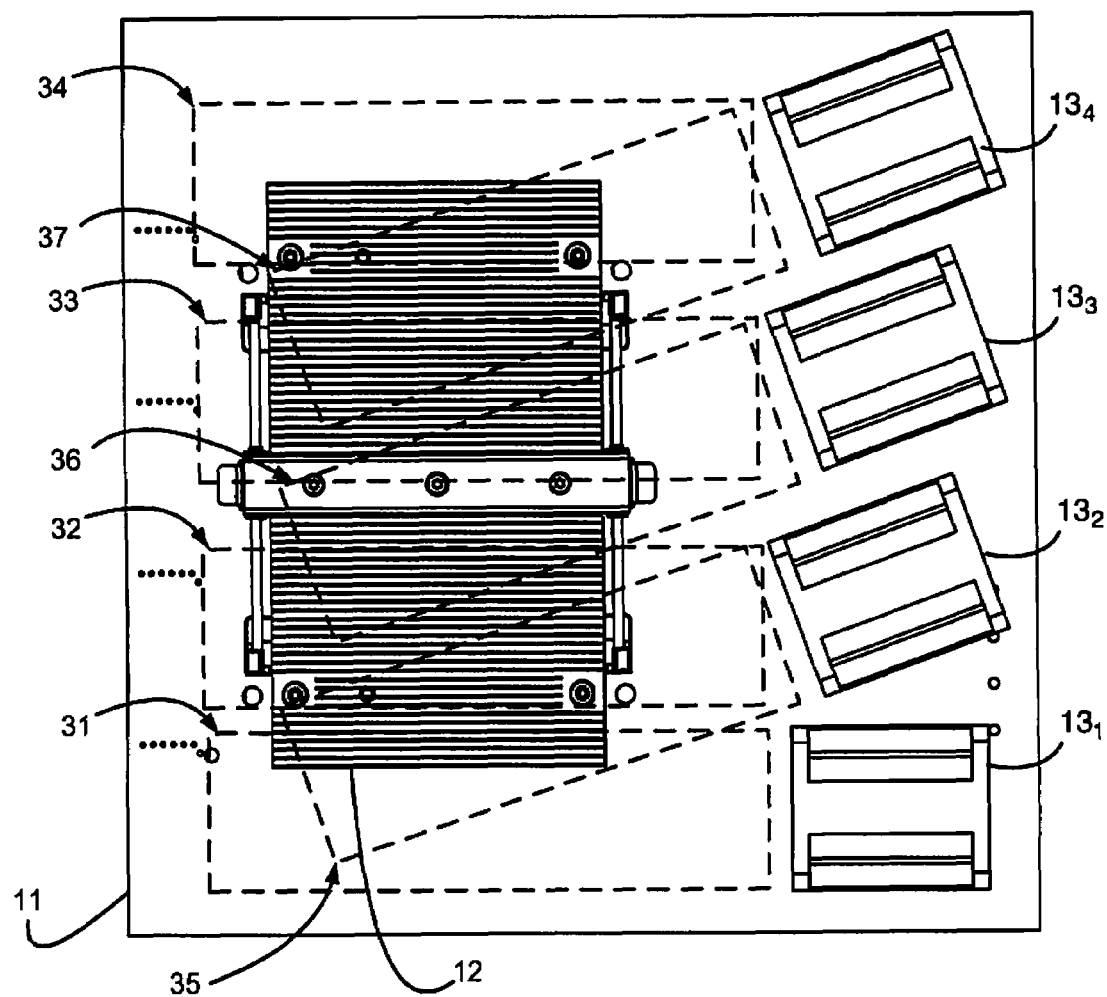
FIG. 9 illustrates, according to an embodiment of the invention, a top view of the apparatus of FIG. 3.

FIG. 9 illustrates a top view of apparatus 15 upon the failure of active cooling device $13_1$. In this particular embodiment rotation occurs due to the average relative pressures differentials of adjacent fluid streams. In other words when a particular active moving device partially fails, the loss of fluid flow from that particular device causes the other active cooling devices to move, adjust position, rotate, etc. Because active cooling device $13_1$ has failed to propel a fluid stream, spatial volume 31 decreases in average pressure. The average pressure in spatial volume 32 is higher relative to the average pressure of spatial volume 31. Because of the pressure difference, active cooling device $13_2$ moves (e.g., rotates) toward spatial volume 31. The fluid stream from active cooling device $13_2$ consequently is located in spatial volume 35. The average pressure of spatial volume 35 after rotating is relatively high. The pressure of spatial volume 32 after active cooling device $13_2$ moves (e.g., rotates) is low. The average pressure in spatial volume 33 is higher relative to the average pressure of spatial volume 32. Because of the pressure difference, active cooling device $13_3$ moves (e.g., rotates) toward spatial volume 32. After rotating, the fluid stream from active cooling device $13_3$ consequently is located in spatial volume 36. The average pressure of spatial volume 36 after rotating is relatively high. The average pressure of spatial volume 33 after rotating is relatively low. The pressure in spatial volume 34 is higher relative to the pressure of spatial volume 33. Because of the pressure difference, active cooling device $13_4$ moves (e.g., rotates) toward spatial volume 33. The fluid stream from active cooling device $13_4$ consequently is located in spatial volume 37. The average pressure of spatial volume 37 after rotating is relatively high. The average pressure of spatial volume 34 after rotating is relatively low. The depicted rotation, as shown in FIG. 9, may not be drawn to scale. For instance actual rotation may be less than as shown in FIG. 9. Further, the amount of rotation of each individual active air moving device may not be similar to any other particular active moving device.

Figure 10:
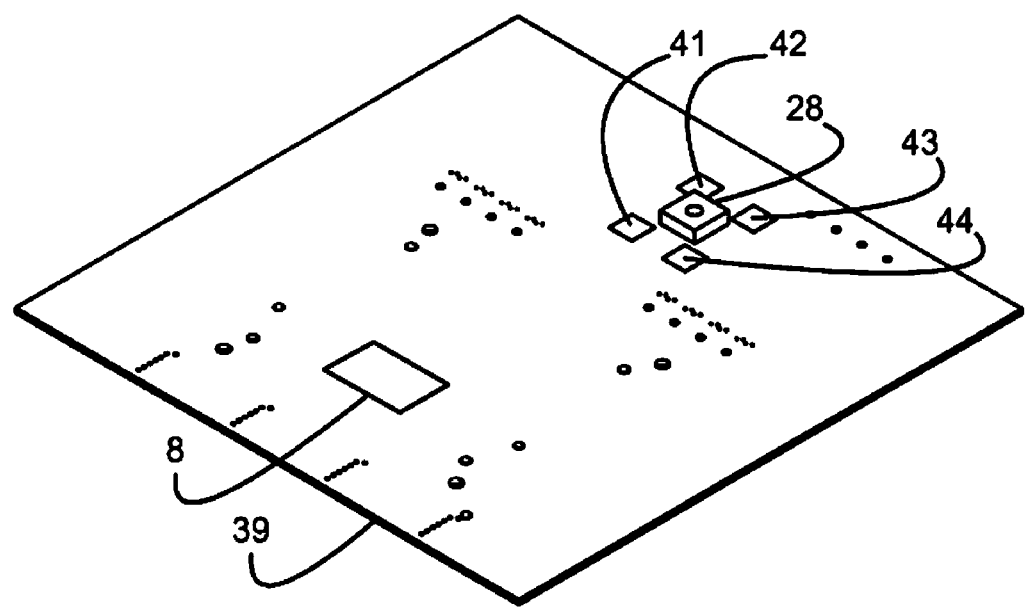
FIG. 10 illustrates, according to an embodiment of the invention, an isometric view of a particular circuit board.
Figure 11:
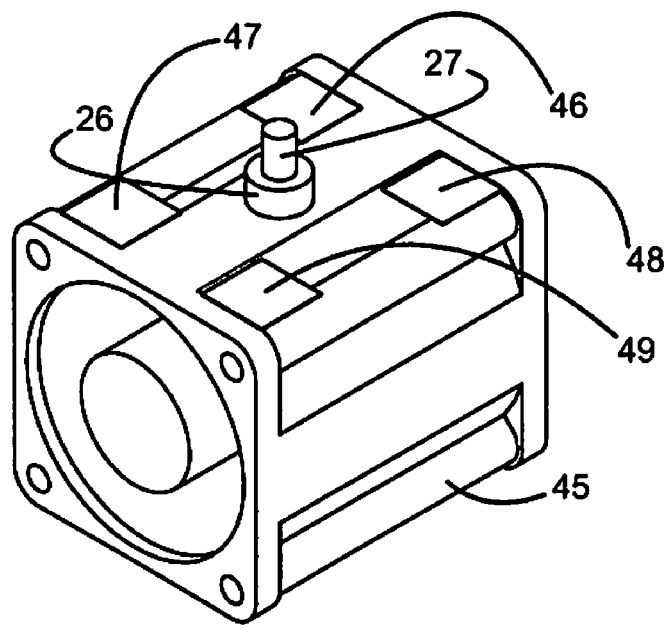
FIG. 11 illustrates, according to an embodiment of the invention, an isometric view of a particular active cooling device supported by the circuit board of FIG. 10.

FIG. 10 illustrates an isometric view of a circuit board 39. FIG. 10 illustrates a further embodiment of the invention in which a bank of active cooling devices adjusts, moves, rotates, etc. on a partial failure of at least one particular cooling device. Circuit board 39 has a connector 28 thereupon configured to interconnect with spindles 26 and 27 of active cooling device 45. Circuit board 39 also has electromagnet elements 41-44 positioned around connector 28. Circuit board 39 provides signals to electromagnet elements 41-44. These signals control the polarity of electromagnet elements 41-44. Connector 28 provides electrical signals (i.e., power, control, rotation speed, polarity etc) to active cooling device 45. FIG. 11 illustrates an isometric view of active cooling device 45 supported by circuit board 39 according to another embodiment of the present invention. On the underside of active cooling device 45, spindles 26 and 27 provide the ability for active cooling device 45 to move (e.g., rotate) relative to circuit board 39. Electro-magnet elements 46-49 are positioned around spindles 26 and 27. When active cooling device 45 is installed to circuit board 39 by inserting spindles 26 and 27 to connector 28, electromagnet elements 41-44 align with electromagnet elements 46-49. Electromagnet element 41 is aligned with electromagnet element 49, electromagnet element 42 is aligned with electromagnet element 48, electro-magnet element 43 is aligned with electromagnet element 46, and electromagnet element 44 is aligned with electromagnet element 47. To control rotation the polarity of particular electromagnet elements 41-44 and/or 46-49 is reversed. For example to control rotation of active cooling device 45 the polarity of electromagnet elements 41-44 are reversed. This results in a moment about axis 7 (as shown in FIG. 2). If rotation is needed in the opposite direction, the polarity of electromagnet elements 46-49 is reversed. An electronic signal from circuit board 39 controls the polarity of electromagnet elements 46-49.

Figure 12:
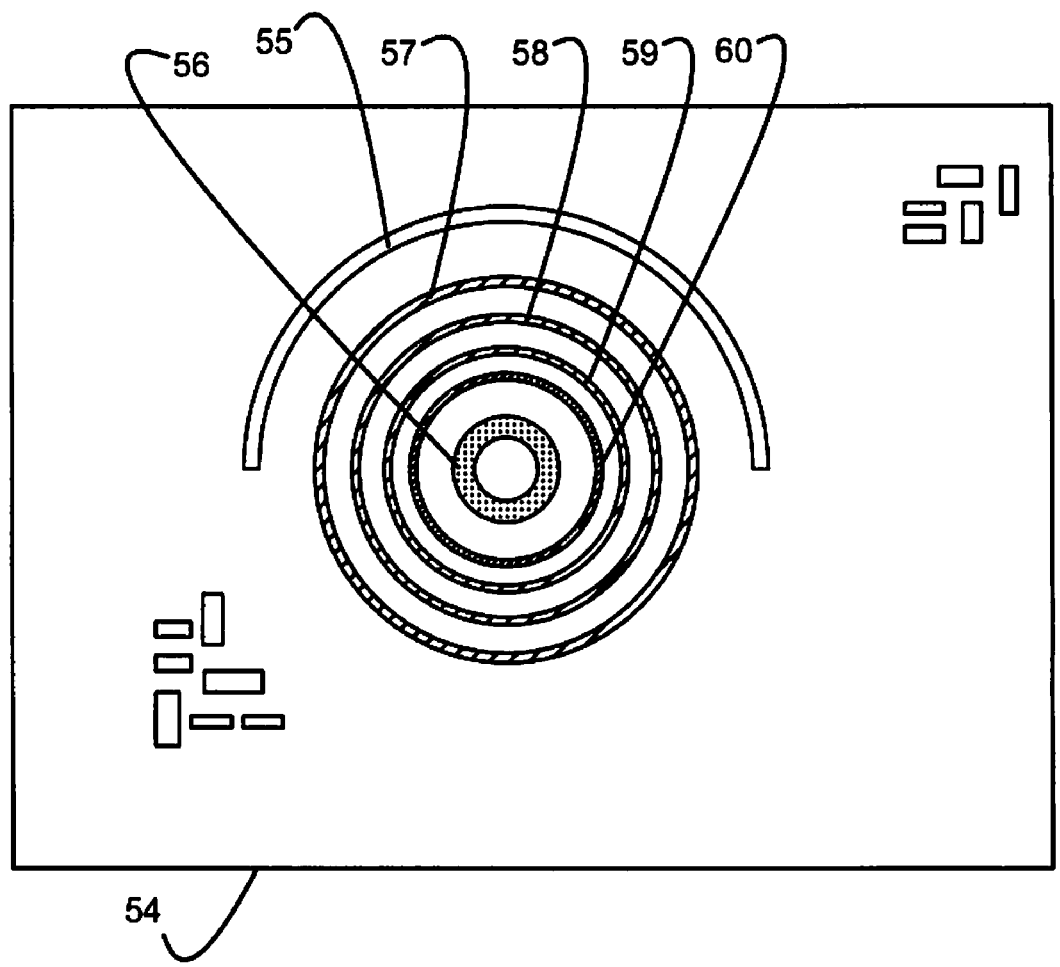
FIG. 12 illustrates, according to an embodiment of the invention, a top view of a particular section of a circuit board.

FIG. 12 illustrates a top view of a section of a circuit board 54 having electrical contact tracks 57-60, connector 56, and direction track 55 thereupon according to another embodiment of the present invention. In a particular embodiment contact track 57 provides a negative signal, contact track 58 provides a good signal (i.e., fan good), contact track 59 provides a PWM (pulse width modulation) input signal (i.e., controlling fan speed), and contact track 60 provides a positive signal to active cooling device 63. Connector 56 may be configured to either provide rotation to active cooling device 63 by utilizing bearing means (not shown) or provide rotation to active cooling device 63 by supporting spindles 26 and 27. Directional track 55 provides rotational direction control and function to active cooling device 63. In a particular example directional track 55 consists of a plurality of polarity producing elements providing functional rotation to active cooling device 63. In another example directional track 55 consists of a plurality of MEMS (micro electrical mechanical systems) providing functional rotation to active cooling device 63. In a particular embodiment, contact tracks 57-60 are not complete circles, but rather partial circular tracks. And in yet another particular embodiment, one portion of contact tracks 57-60 provide signals to a first blade (not shown) in active cooling device 63 (FIG. 13) that moves (e.g. rotates) in a first direction. A second portion of contact tracks 57-60 provides signals to a second blade (not shown) in active cooling device that moves (e.g., rotates) in a second direction.

Figure 13:
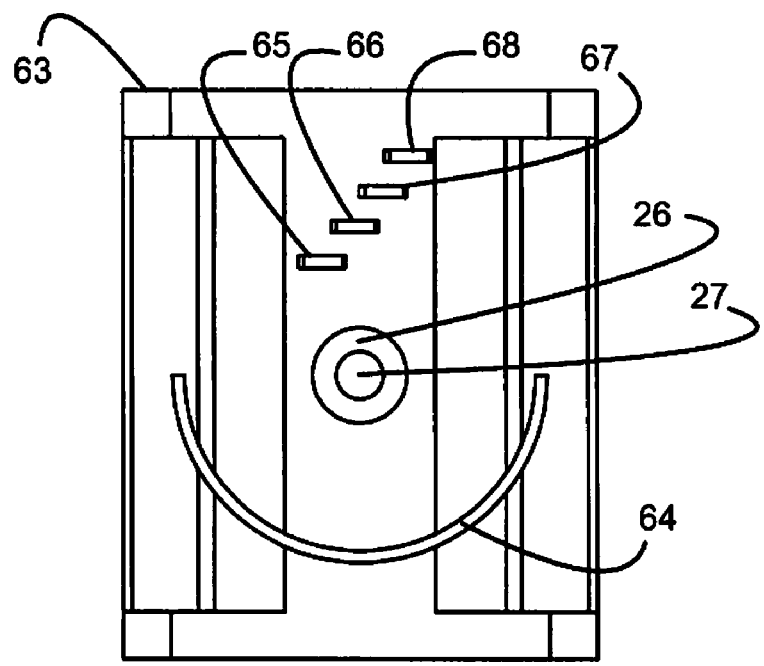
FIG. 13 illustrates, according to an embodiment of the invention, a bottom view of a particular active cooling device supported by the circuit board of FIG. 12.
Figure 14:
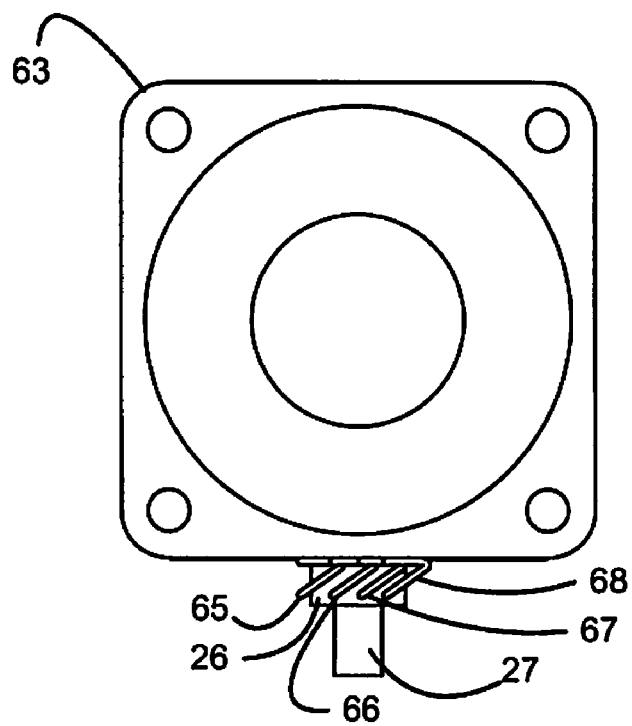
FIG. 14 illustrates a front view of the particular active cooling device of FIG. 13.

FIG. 13 and FIG. 14 illustrate active cooling device 63 that is supported by circuit board 54. The underside of active cooling device 63 has contact members 65-68, spindles 26 and 27, and directional track 64 arranged thereupon. Contact members 65-68 contact and receive the respective signals outputted by the contact tracks 57-60 (FIG. 12). Directional track 64 provides rotational direction control and function to active cooling device 63. In a particular example directional track 64 consists of a plurality of polarity producing elements providing functional rotation to active cooling device 63. In another example directional track 64 consists of a plurality of MEMS (micro electrical mechanical systems) providing functional rotation to active cooling device 63.

Figure 15:
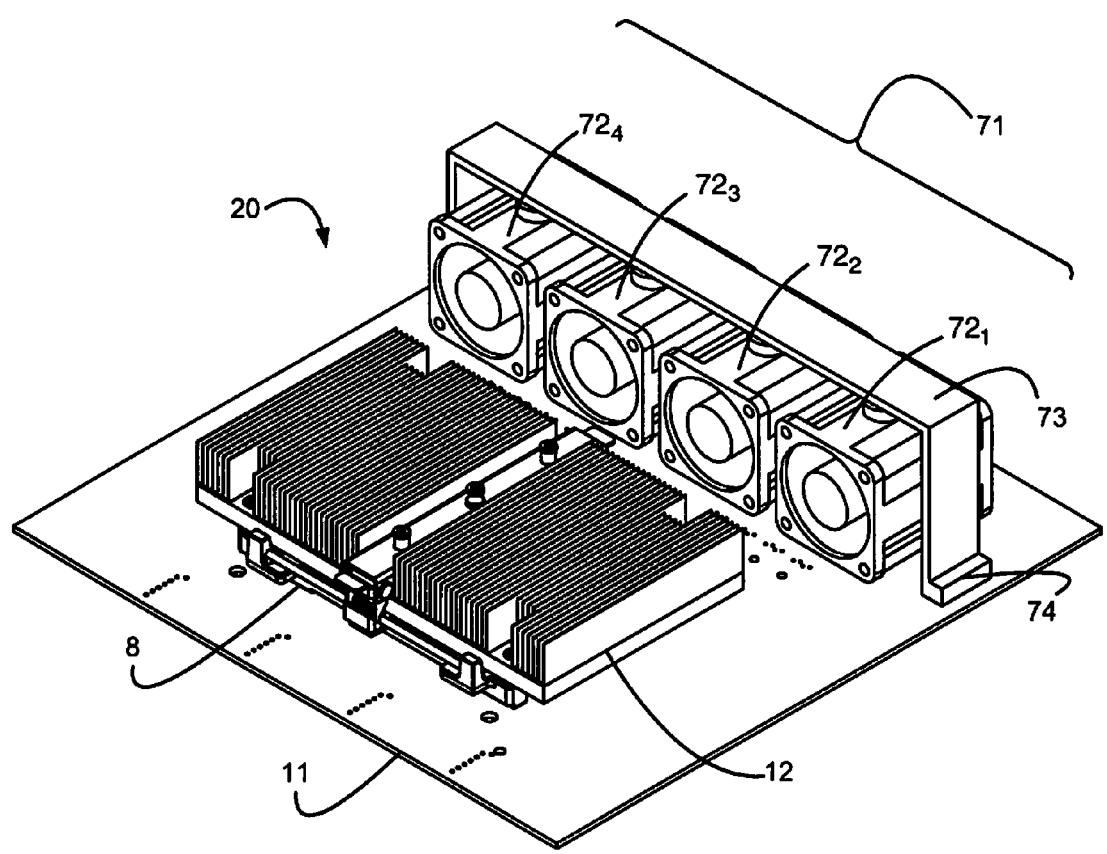
FIG. 15 illustrates, according to an embodiment of the invention, a particular arrangement for cooling an electronic system.
Figure 16:
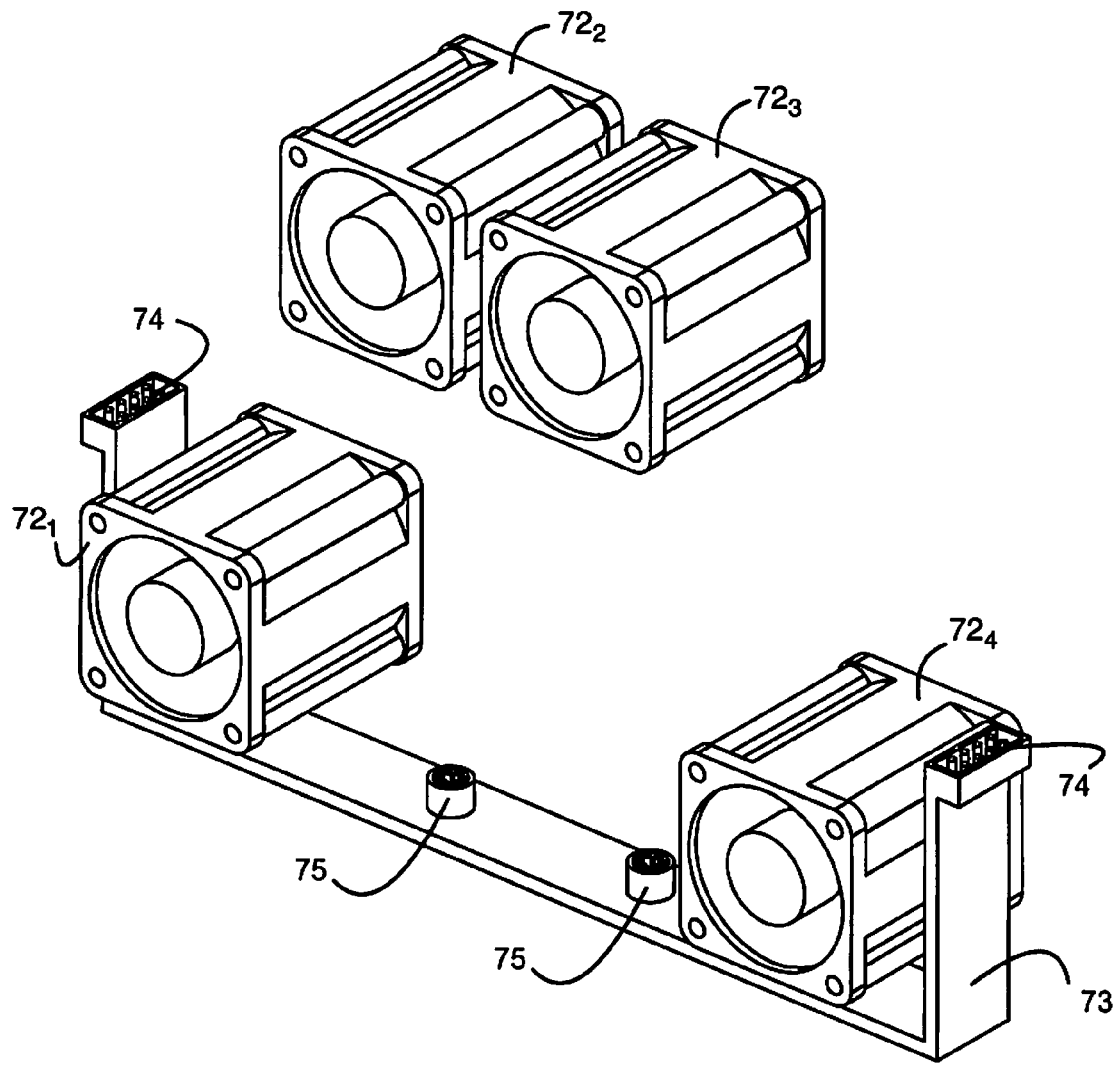
FIG. 16 illustrates, according to an embodiment of the invention, an isometric assembly view of a particular supporting connector and a plurality of particular active cooling devices.
Figure 17A:
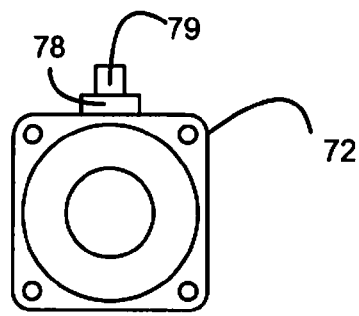
FIG. 17A illustrates a front view of the particular active cooling device of FIG. 16.
Figure 17B:
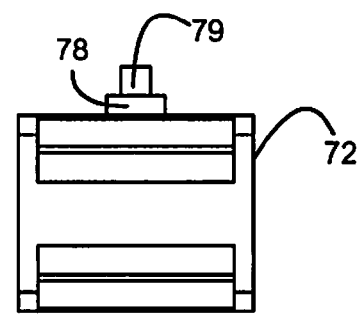
FIG. 17B illustrates a side view of the particular active cooling device of FIG. 16.
Figure 17C:
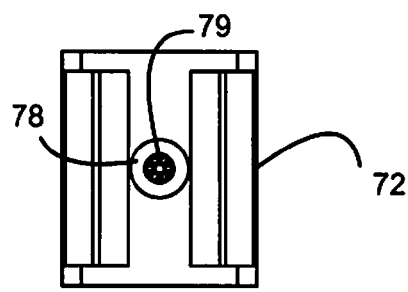
FIG. 17C illustrates a bottom view of the particular active cooling device of FIG. 16.
Figure 17D:
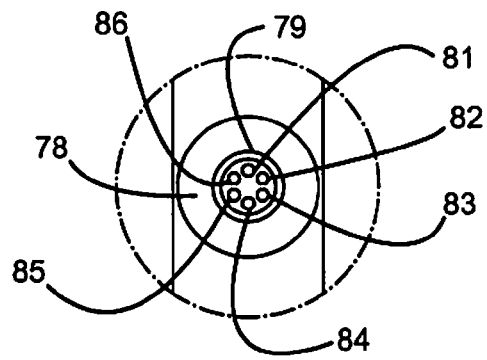
FIG. 17D illustrates an enhanced bottom view of the particular active cooling device of FIG. 16.
Figure 18A:
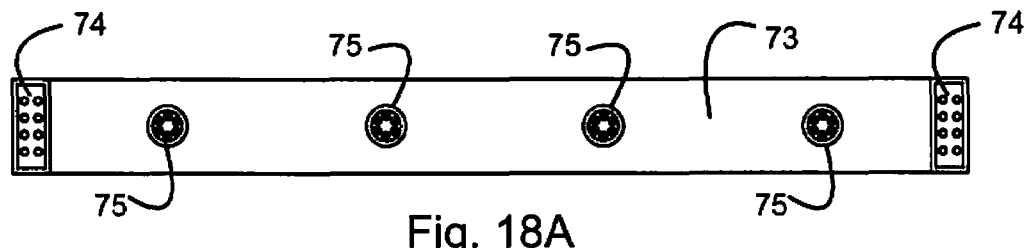
FIG. 18A illustrates a bottom view of the particular supporting connector of FIG. 16.
Figure 18B:
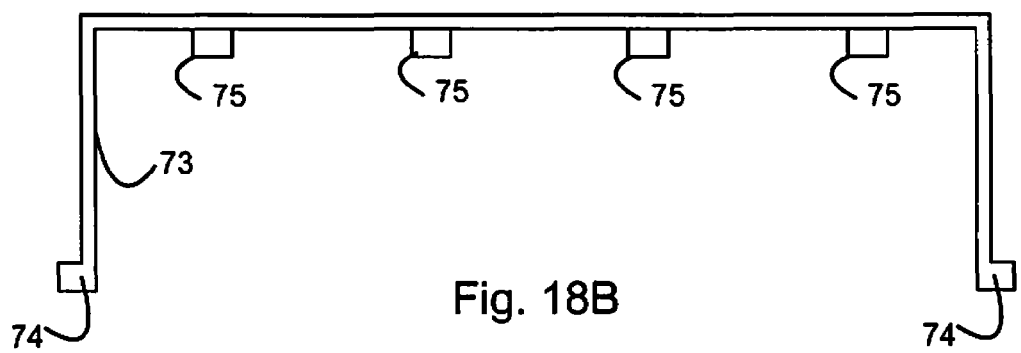
FIG. 18B illustrates a front view of the particular supporting connector of FIG. 16.
Figure 18C:
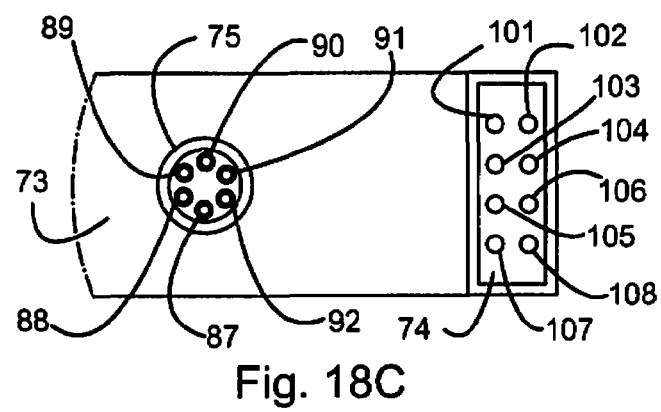
FIG. 18C illustrates an enhanced bottom view of the particular supporting connector of FIG. 16.

FIG. 15 illustrates apparatus 20 for cooling an electronic system. FIG. 16, FIGS. 17A-D, and FIGS. 18A-C illustrate components of apparatus 20. Apparatus 20 consists of circuit board 11, heat generating component 8 having heat dissipating element 12 thereupon, a bank 71 of cooling devices $72_1$-$72_4$, and support 73 having an integrated connector(s) 74. Cooling devices $72_1$-$72_4$, herein referred to generically as cooling devices 72, move (e.g., rotate) relative to circuit board 11 about connectors 75 on support 73. Support 73 is joined to circuit board 11 by one or more connectors 74. Cooling devices 72 are installed to support 73, by attaching spindles 78 and 79 to connectors 75. This sub assembly is installed to circuit board 11 by attaching connector(s) 74 to associated connectors (not shown) located on circuit board 11.

Active cooling device 72 utilizes multiple signal pins 81-86 to effectively receive and/or output multiple signals from circuit board 11. Circuit board 11, and active cooling device 72 carry and/or generate multiple signals (i.e., positive, negative, PWM, good, tach (i.e., a component used for measuring the rate of revolution of a shaft), light emitting diode (LED) positive, LED negative, etc.) used to control different aspects of active cooling device 72, or provide information about active cooling device 72 to another electrical component (not shown). These signals are received and/or outputted on signal pins 101-108 in connector 74 and are routed through support 73 using internal conductive paths (not shown) and enter/exit support 73 upon signals pins 87-92. Signal pins 81-86 rotate relative to spindles 78 and 79. Signal pins 87-92 rotate relative to connector 75 and support 73. In a particular embodiment, active cooling device 72 utilizes only one spindle.

Figure 19:
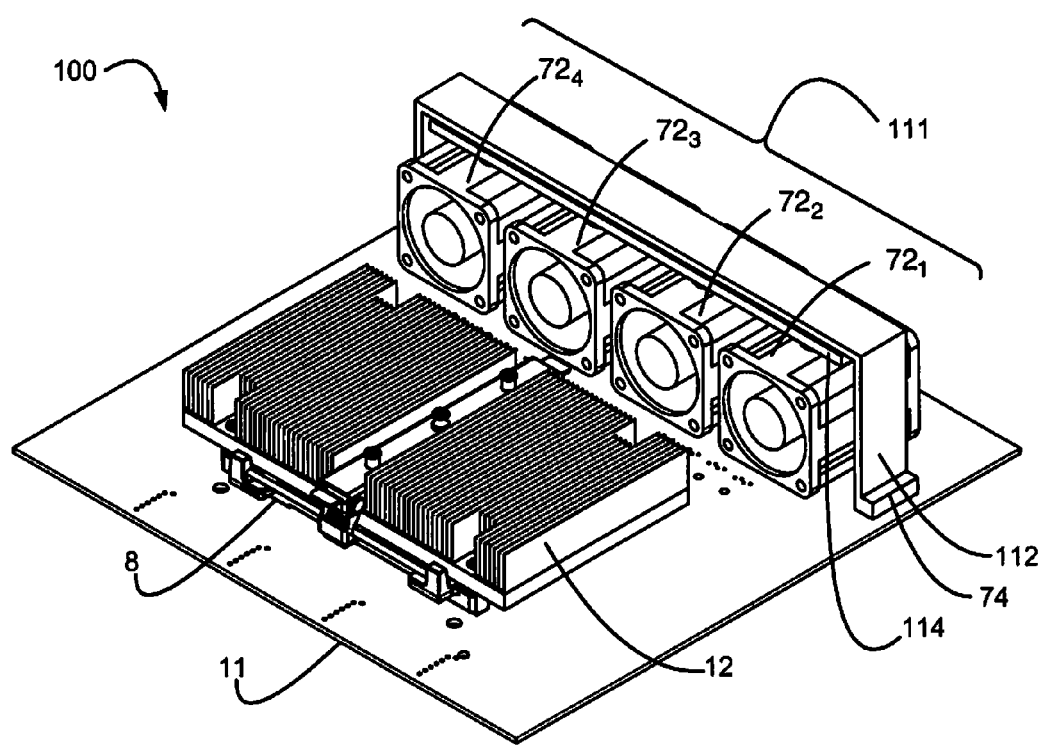
FIG. 19 illustrates, according to an embodiment of the invention, an apparatus for cooling an electronic system in a normal operating configuration.
Figure 20:
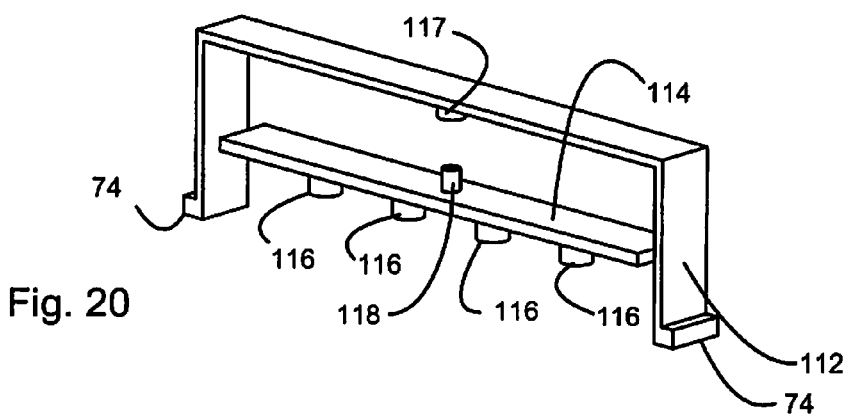
FIG. 20 illustrates, according to an embodiment of the invention, an support structure supporting and providing rotation to a bank of cooling devices.

FIG. 19 illustrates apparatus 100 for cooling an electronic system in a normal operating configuration, and FIG. 20 illustrates components of apparatus 100. Apparatus 100 comprises circuit board 11, heat generating component 8 having heat dissipating element 12 thereupon, a bank 111 of cooling devices $72_1$-$72_4$, and support 112 having an integrated connector 117. Bank 111 is attached to intermediary 114 and moves (e.g. rotates) relative to circuit board 11. Support 112 is joined to circuit board 11 by one or more connectors 74. Cooling devices 72 are installed to intermediary 114, by attaching connector means 78 and 79 to connectors 116. This sub assembly is attached to support 112 by interconnecting connectors 117 and 118. This higher level sub assembly is installed to circuit board 11 by attaching connector(s) 74 to associated connectors (not shown) located on circuit board 11. Connector 117 and/or 118 moves (e.g. rotates) relative to support 112 and intermediary 114 respectively enabling intermediary 114 to move (e.g. rotate) relative to support 112.

Figure 21:
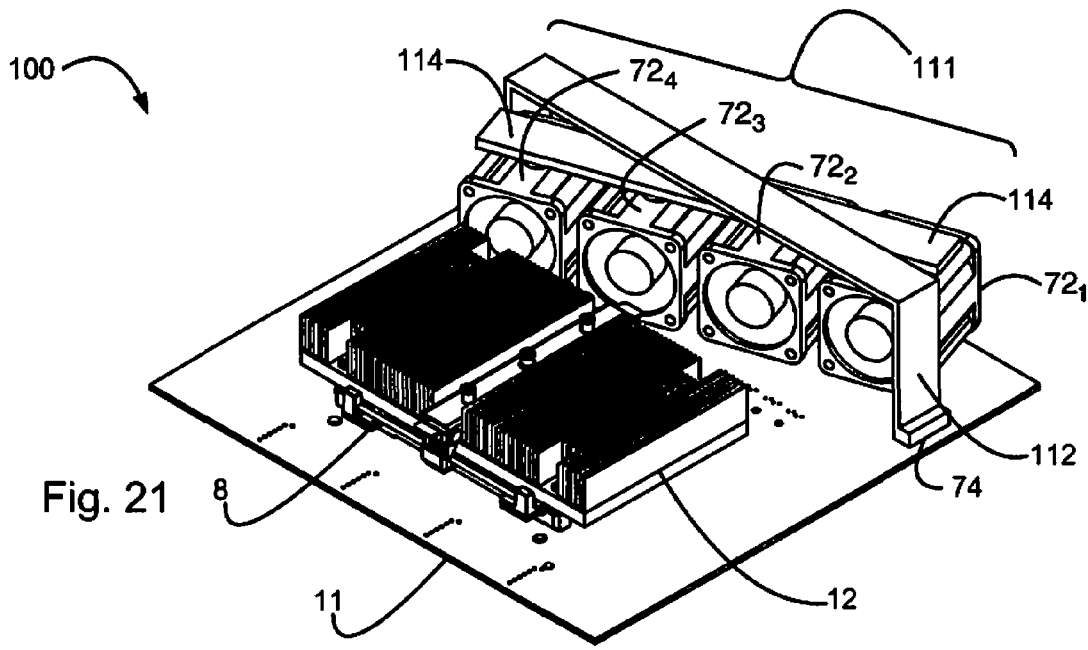
FIG. 21 illustrates, according to an embodiment of the invention, the apparatus of FIG. 20 in a configuration wherein at least one active cooling device has failed.
Figure 22:
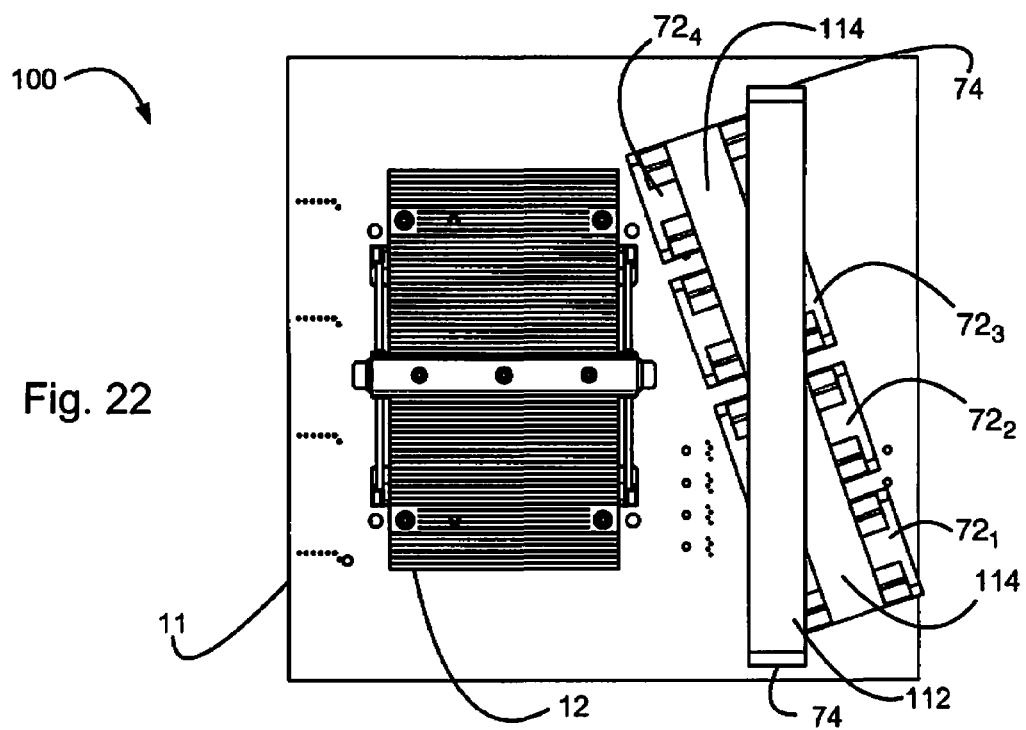
FIG. 22 illustrates a top view of the apparatus of FIG. 21.

FIG. 21 and FIG. 22 illustrate apparatus 100 in a configuration wherein at least one active cooling device has failed. In a particular embodiment active cooling device $72_1$ has failed. At least one remaining functional cooling devices $72_2$-$72_4$ is throttled higher, thereby propelling the respective fluid streams at a higher flow rate. In this particular embodiment, active cooling device $72_2$ is throttled more than the other functional cooling devices $72_3$ and $72_4$. The force of the propelled fluid stream, from active cooling device $72_2$ creates a moment about connector 118. The moment causes intermediary 114 and bank 111 to move (e.g., rotate). To aid in rotation active cooling device $72_3$ and $72_4$ may be throttled down, thereby propelling fluid at a lower flow rate and increasing the moment about connector 118. In an alternative embodiment bank 111 is forcibly moved (e.g., rotated) upon a particular active cooling device failure. Bank 111 is moved (e.g., rotated) by a force mechanism (not shown) that places a force or moment upon the intermediary 114.

Figure 24:
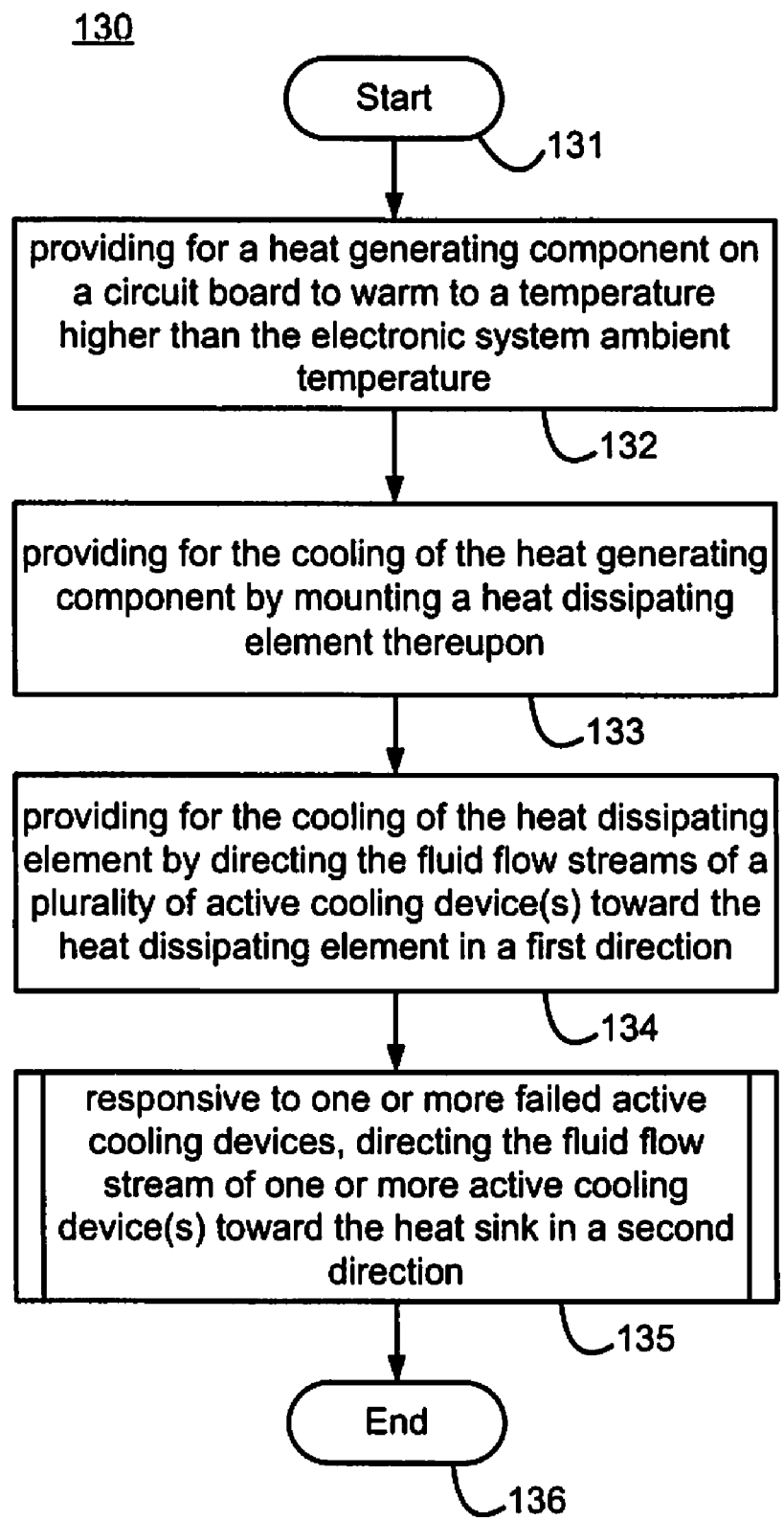
FIG. 24 illustrates, according to an embodiment of the invention, a method providing for real time adaptive active fluid flow cooling.

FIG. 24 illustrates a method 130 of providing for real time adaptive active fluid flow cooling, according to an embodiment of the invention. Providing for adaptive active fluid flow cooling begins at block 131. Method 130 continues by providing for a heat generating component on a circuit board within an electronic system to warm to a temperature higher than the electronic system ambient temperature (block 132). Method 130 continues by providing for the cooling of the heat generating component by mounting a heat dissipating element thereupon (block 133). Method 130 continues by providing for the cooling of the heat dissipating element by directing the fluid flow streams of a plurality of active cooling device(s) toward the heat dissipating element in a first direction (block 134). Method 130 continues responsive to one or more failed active cooling devices, by providing for directing the fluid flow stream of one or more active cooling device(s) toward the heat dissipating element in a second direction (block 135). Method 130 ends at block 136.

In the previous detailed description of exemplary embodiments of the invention, reference was made to the accompanying drawings (where like numbers represent like elements), which form a part hereof, and in which is shown by way of illustration specific exemplary embodiments in which the invention may be practiced. These embodiments were described in sufficient detail to enable those skilled in the art to practice the invention, but other embodiments may be utilized and logical, mechanical, electrical, and other changes may be made without departing from the scope of the present invention. In the previous description, numerous specific detains were set forth to provide a through understanding of embodiments of the invention. But, the invention may be practiced without these specific details. In other instances, well known structures, and techniques have not been shown in detail in order not to obscure the invention. Different instances of the word "embodiment" as used within this specification do not necessarily refer to the same embodiment, but they may. The previous detained description is, therefore, not to be taken in a limiting sense, and the scope of the present invention is defined only by the appended claims. The terms failure and partial failure are used interchangeably to denote any failure or deviation from normal operation.

The invention claimed is:

1. An apparatus for cooling an electronic system, the apparatus comprising:
   an electronic system having a heat generating component;
   a heat dissipating element mounted to the heat generating component;
   a plurality of active cooling devices that propel an fluid flow stream in a first direction toward the heat dissipating element, and in response to a partial failure of the plurality of active cooling devices, at least a particular active cooling device propels a fluid flow stream in a second direction toward the heat dissipating element, wherein individual active cooling devices are able to rotate about an axis perpendicular relative to a circuit board, wherein the partial failure causes at least one active cooling device to emit a lower fluid flow rate, and wherein the rotation is caused by pressure differences between the fluid flow of the functioning one or more active cooling devices and the fluid flow of the at least one partially failed active cooling device.

2. The apparatus of claim 1 wherein the plurality of active cooling devices are able to rotate relative to the circuit board.

3. The apparatus of claim 2 wherein the rotation of the plurality of active cooling devices is about an axis perpendicular to the circuit board.

4. The apparatus of claim 1 wherein the flow rate of the propelled fluid stream from the functioning one or more active cooling devices is increased or decreased.

5. An electronic system comprising:
a circuit board having a heat generating component;
a heat dissipating element mounted to the heat generating component;
a plurality of active cooling devices that propel an fluid flow stream in a first direction toward the heat dissipating element, and in response to a partial failure of the plurality of active cooling devices, at least a particular active cooling device propels a fluid flow stream in a second direction toward the heat dissipating element, wherein individual active cooling devices are able to rotate about an axis perpendicular to a circuit board, wherein the partial failure causes at least one active cooling device to emit a lower fluid flow rate, and wherein the rotation is caused by pressure differences between the fluid flow of the functioning one or more active cooling devices and the fluid flow of the at least one partially failed active cooling device.

6. The electronic system of claim 5 wherein the plurality of active cooling devices are able to rotate relative to the circuit board.

7. The electronic system of claim 6 wherein the rotation of the plurality of active cooling devices is about an axis perpendicular to the circuit board.

8. The apparatus of claim 5 wherein the flow rate of the propelled fluid stream from the functioning one or more active cooling devices is increased or decreased.

* * * * *